US009812457B1

(12) United States Patent
Harjani et al.

(10) Patent No.: US 9,812,457 B1
(45) Date of Patent: Nov. 7, 2017

(54) ULTRA HIGH DENSITY INTEGRATED COMPOSITE CAPACITOR

(71) Applicant: Regents of the University of Minnesota, Minneapolis, MN (US)

(72) Inventors: Ramesh Harjani, Minneapolis, MN (US); Rakesh Kumar Palani, Tustin, CA (US); Saurabh Chaubey, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 15/132,326

(22) Filed: Apr. 19, 2016

(51) Int. Cl.
| | |
|---|---|
| *H01L 21/00* | (2006.01) |
| *H01L 27/108* | (2006.01) |
| *H01L 49/02* | (2006.01) |
| *H01L 27/146* | (2006.01) |
| *H01L 27/12* | (2006.01) |
| *H01L 27/08* | (2006.01) |

(52) U.S. Cl.
CPC ........ *H01L 27/10805* (2013.01); *H01L 28/40* (2013.01); *H01L 27/0805* (2013.01); *H01L 27/1255* (2013.01); *H01L 27/14689* (2013.01)

(58) Field of Classification Search
CPC ............... H01L 28/40; H01L 27/10805; H01L 27/14689; H01L 27/1255; H01L 27/0805
See application file for complete search history.

(56) References Cited

U.S. PATENT DOCUMENTS

| 5,939,742 | A * | 8/1999 | Yiannoulos | ....... H01L 27/14609 |
| | | | | 257/291 |
| 6,559,689 | B1 * | 5/2003 | Clark | ................... H03K 17/063 |
| | | | | 327/337 |
| 2005/0030827 | A1 * | 2/2005 | Gilliland et al. | ............. 365/232 |
| 2009/0201723 | A1 * | 8/2009 | Okhonin | ............... G11C 11/404 |
| | | | | 365/177 |
| 2013/0027066 | A1 * | 1/2013 | Charbuillet | ............. H01L 22/34 |
| | | | | 324/750.01 |

OTHER PUBLICATIONS

Andreani et al., "On the Use of MOS Varactors in RF VCO's," IEEE Journal of Solid-State Circuits, vol. 35, No. 6, Jun. 2000, 8 pp.
(Continued)

*Primary Examiner* — Nicholas Tobergte
(74) *Attorney, Agent, or Firm* — Shumaker & Sieffert, P.A.

(57) ABSTRACT

Capacitors that can be formed fully on an integrated circuit (IC) chip are described in this disclosure. An IC chip includes a metal-oxide-silicone (MOS) capacitor formed from a MOS transistor having a drain terminal, a source terminal, a gate terminal, and a body terminal. The drain terminal and the source terminal are not electrically connected to any other node, and the gate terminal and the body terminal form respective first and second terminals of the MOS capacitor. The IC chip also includes an electrical conductor coupled to one of the gate terminal or the body terminal of the MOS transistor and configured to deliver a voltage to operate the MOS capacitor in an accumulation mode.

20 Claims, 6 Drawing Sheets

(56) References Cited

OTHER PUBLICATIONS

Chiu et al., "Metal-layer capacitors in the 65 nm CMOS process and the applciation for low-leakage power-rail ESD clamp circuit," Microelectronics Reliability 54, Elsevier, Sep. 21, 2013, 9 pp.

DRAM, "Dynamic Random Access Memory (DRAM) Cells with intergrated high-k dielectrics," IHP—Introduction, retrieved from http://www.ihp-microelectronics.com/de/forschul19'materialien-fuer-die-mikro-und-nanoelektronik/abgeschlossene-projekte/dram/introduction.html on Sep. 16, 2016, 2 pp.

Johari et al., "High-Density Embedded Deep Trench Capacitors in Silicon with Enhanced Breakdown Voltage," IEEE Transactions on Components and Packaging Technology, vol. 32, No. 4, Dec. 2009, 10 pp.

Yeo et al., "MOSFET Gate Leakage Modeling and Selection Guide for Alternative Gate Dielectrics Based on Leakage considerations," IEEE Transactions on Electron Devices, vol. 50, No. 4, Apr. 2003, 11 pp.

Popovich, "High Performance Power Distribution Networks with On-Chip Decoupling Capacitors for Nanoscale Integrated Circuits," Department of Electrical and Computer Engineering, College of Engineering and Applied Sciences, 2007, Presented Feb. 11, 2008, 370 pp.

Richardson et al., "A Trench Transistor Cross-Point Dram Cell," 1985 International Electron Devices Meeting, IEDM Technical Digest, Dec. 1-4, 1985, 6 pp.

Roozeboom et al., "Ultrahigh-density (> 0.4 μF/mm2) Trench Capacitors in Silicon," First Int. Workshop on Power Supply on Chip (PowerSoC08), Sep. 22-24, 2008, 52 pp.

Tuite, "Three Industry Leaders Track Analog Chip Trends," Electronic Design, Jan. 7, 2010, 7 pp.

\* cited by examiner

ULTRA HIGH DENSITY INTEGRATED COMPOSITE CAPACITOR

TECHNICAL FIELD

The disclosure relates to capacitors, and more particularly to fully on-chip capacitors.

BACKGROUND

Most integrated circuits (ICs) include on-chip passive electrical components like capacitors. On-chip capacitors, also referred to as integrated capacitors, are typically rated based on their quality (Q) factor, effective series resistance (ESR), effective series inductance (ESL), bottom plate parasitic, and static leakage. In addition, as there is frequently limited space available on a given chip, integrated capacitors tend to be relatively small in size relative to other components on the chip. As a result, circuit designers weigh various factors, in combination with fabrication complexity, to design suitable integrated capacitors.

SUMMARY

This disclosure describes a metal-oxide-silicon (MOS) capacitor that can be formed on-chip and provides high capacitive density with low leakage, while being operable as a two terminal capacitor (e.g., one terminal need not always have to be coupled to ground). In various examples, the capacitor is formed as a MOS transistor where the gate and body are respective terminals of the capacitor and the source and drain terminals of the transistor are floating (e.g., no charge flows through the source or drain terminals). Such a configuration of the described capacitor provides high capacitive density and, when the transistor is operating in the accumulation mode, leakage may be substantially reduced. Because the capacitor can be fabricated from a MOS transistor, the capacitor may be fabricated without needing specialized semiconductor manufacturing processes that are not available for all types of integrated circuits or facilities.

In one example, the disclosure describes an integrated circuit (IC) chip comprising a metal-oxide-silicone (MOS) capacitor comprising a MOS transistor having a drain terminal, a source terminal, a gate terminal, and a body terminal. The drain terminal and the source terminal are not electrically connected to any other node within the IC chip so as to be electrically floating within the IC chip, and the gate terminal and the body terminal of the MOS transistor form respective first and second terminals of the MOS capacitor.

In one example, the disclosure describes an electronic device comprising a voltage source configured to deliver voltage and an integrated circuit (IC) chip. The IC chip includes a metal-oxide-silicone (MOS) capacitor formed from a MOS transistor having a drain terminal, a source terminal, a gate terminal, and a body terminal. The drain terminal and the source terminal are not electrically connected to any other node so as to be electrically floating within the IC chip, and the gate terminal and the body terminal of the MOS transistor form respective first and second terminals of the MOS capacitor. The first terminal is coupled to the voltage source, the second terminal is coupled to ground, the voltage delivered by the voltage source configures the MOS transistor in an accumulation mode, and the MOS capacitor is configured to decouple the voltage delivered by the voltage source.

In one example, the disclosure describes an electronic device comprising a controller configured to output a voltage representing a logic one or a logic zero and a memory cell. The memory cell includes a metal-oxide-silicone (MOS) capacitor formed from a MOS transistor having a drain terminal, a source terminal, a gate terminal, and a body terminal. The drain terminal and the source terminal are not electrically connected to any other node. The gate terminal and the body terminal form respective first and second terminals of the MOS capacitor. The MOS transistor operates in an accumulation mode, and the MOS capacitor is configured to store charge from the voltage output by the controller to store a logic one or discharge from the voltage output by the controller to store a logic zero.

In one example, the disclosure describes a method of manufacturing an integrated circuit (IC) chip to provide capacitance within the IC chip, the method comprising forming a metal-oxide silicon (MOS) transistor on the IC chip, wherein the MOS transistor is part of a composite capacitor. The method also includes coupling a first electrical node of the IC chip to a first terminal of the composite capacitor without coupling source and drain terminals of the MOS transistor to any other node so as to be electrically floating within the IC chip. The first terminal of the composite capacitor is coupled to one of a body terminal or gate terminal of the MOS transistor. The method further includes coupling a second electrical node of the IC chip to a second terminal of the composite capacitor without coupling source and drain terminals of the MOS transistor to any other node so as to be electrically floating within the IC chip. The second terminal of the composite capacitor is coupled to the other of the body terminal or gate terminal of the MOS transistor.

The details of one or more aspects of the disclosure are set forth in the accompanying drawings and the description below. Other features, objects, and advantages of the disclosure will be apparent from the description and drawings, and from the claims.

DETAILED DESCRIPTION

This disclosure describes a two terminal high capacitive density capacitor formed from standard CMOS processes directly on-chip. In some examples, this capacitor may be coupled in parallel with one or more capacitors, and the parallel combination of capacitors forms a composite capacitor. The one or more capacitors that are in parallel with the high capacitive density capacitor may have relatively low static leakage of current. By combining the high capacitive density capacitor with the capacitor(s) having low static leakage and driving the high capacitive density capacitor in accumulation mode, the composite capacitor may provide high capacitive density and low leakage that is comparable to deep trench capacitors. Leakage may account for 30%-40% of power consumption. Accordingly, keeping leakage low, but having high capacitive density may be beneficial for integrated circuit (IC) chips.

The composite capacitor may be formed using standard CMOS processes, but deep trench capacitors tend to require highly specialized processes and may not be available in all standard CMOS processes. This disclosure describes a relatively inexpensive substitute that is available in all standard CMOS processes to the highly specialized and expensive deep trench capacitors that may not be available in all standard CMOS processes. In this way, the techniques described in this disclosure allow for a capacitor fully formed on-chip that provides functional benefits similar to those of deep trench capacitors but can be formed without needing specialized CMOS processes.

Figure 1:
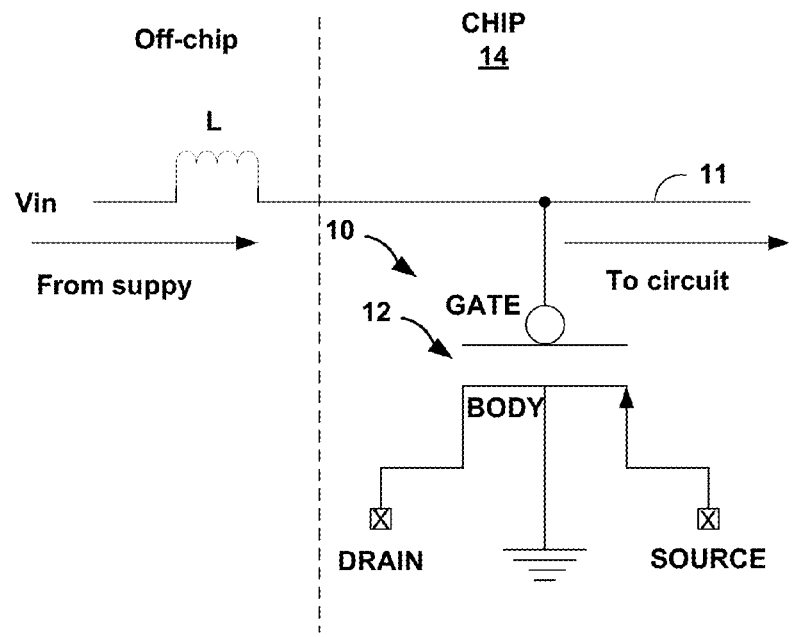
FIG. 1 is a block diagram illustrating an integrated circuit (IC) chip that includes a capacitor in accordance with one or more examples described in this disclosure.

FIG. 1 is a block diagram illustrating an integrated circuit (IC) chip that includes a capacitor in accordance with one or more examples described in this disclosure. Chip 14 may be an example of an analog and/or digital very-large-scale integration (VLSI) system. Examples of chip 14 include analog or digital chip such as microprocessors, application specific integrated circuits (ASICs), field programmable gate arrays (FPGAs), and the like. As some additional examples, chip 14 may be a DC-DC converter chip, a filter chip (e.g., low pass, bandpass, or high pass filter), a memory cell, an oscillator, and the like.

VLSI systems are designed to include integrated (e.g., on-chip) passive components. One example of a passive component is a capacitor which can be used in VLSI circuits ranging from radio frequency (RF) front ends to switch capacitor DC-DC converters and from digital decoupling capacitors to passives in oscillators. In these examples of VLSI systems, the on-chip capacitors may need to be of relative high quality. However, as processes to generate VLSI circuits are getting smaller and smaller, issues with parasitic and static leakage become worse.

On-chip capacitors can be formed as metal-insulator-metal (MIM) capacitors, metal-oxide-metal (MOM) capacitors, poly insulator poly (POLY-POLY) capacitors, metal-oxide-semiconductor (MOS) capacitors, and deep trench capacitors. In general, MIM and MOM capacitors are well suited for applications sensitive to leakage or sensitive to good quality (Q) factors but are less area efficient as compared to MOS and deep trench capacitors. Static leakage is measured as amperes per area (e.g., $pA/um^2$), and area efficiency (also referred to as a capacitive density) is measured as farads per area (e.g., $fF/um^2$). POLY-POLY capacitors have low capacitive density while performing poorly in terms of static leakage and tend not to be used as much.

Deep trench capacitors, which are literally formed by making deep trenches in the chip material, tend to provide the best capacitive density with reasonably good quality for the other parameters (e.g., reasonably low leakage). However, developing deep trench capacitors is not available in all fabrication processes that may be used to form chip 14.

A fabrication process refers to the manner in which transistors of chip 14 are formed and tend to be defined based on the smallest sized transistor the process can support. Example fabrication processes include complementary metal-oxide semiconductor (CMOS) for transistors of size 65 nm, 45 nm, 32 nm, and even smaller. As described in more detail, the capacitors described in this disclosure may be formed on any of these standard CMOS processes without needing specialized processes, while providing characteristics similar to deep trench capacitors.

While deep trench capacitors provide high capacitive density and relatively low leakage, forming deep trench capacitors requires specialized processing steps and are only available in few selected processes (e.g., 45 nm, 32 nm, etc.). Accordingly, where leakage is not of concern, circuit designers tend to prefer MOS capacitors. However, the parasitic capacitance of the bottom plate of such MOS capacitors tends to be high (e.g., the capacitance of the bottom plate changes based on the applied voltage). This limits the usability of MOS capacitors, where the bottom plate of the MOS capacitor needs to be tied to ground and so the MOS capacitors tend to be used as a one terminal decoupling capacitors.

A MOS capacitor is formed as a MOS transistor, where the gate terminal of the MOS transistor forms one of the terminals of the capacitor. In some examples, the source, drain, and body (also called substrate) terminals of the MOS transistor are connected together and form the other terminal of the capacitor. In examples where the MOS transistor is a p-channel MOS transistor and the MOS capacitor is driven in accumulation mode, and the source, drain, and body terminals are connected together, the gate is the positive terminal of the capacitor and the connection of the source, drain, and body terminals is the negative terminal of the capacitor. In examples where the MOS transistor is a p-channel MOS transistor and the MOS capacitor is driven in inversion mode, and the source, drain, and body terminals are connected together, the gate is the negative terminal of the capacitor and the connection of the source, drain, and body terminals is the positive terminal of the capacitor.

For p-channel MOS transistor, the accumulation mode is when the difference between the voltage at the gate terminal and the voltage at the body terminal ($V_{GB}$) is greater than a flatband voltage ($V_{FB}$) defined as the voltage at which there is no charge on the plates of the capacitor. In some examples, the $V_{FB}$ voltage may be approximately zero so that if the voltage at the gate terminal is greater than the voltage at the body terminal, the MOS capacitor is in accumulation mode. For p-channel MOS transistor, the inversion mode is when $V_{GB}$ is less than a threshold voltage ($V_T$) defined as the gate voltage at which the conductivity type of a surface layer of the MOS transistor changes from n-type to p-type.

Although the above is described with respect to p-channel MOS transistors, the MOS capacitor may be formed with respect to n-channel MOS transistors as well. For n-channel MOS transistors, accumulation mode is when $V_{GB}$ is less than $V_{FB}$ (typically −0.8~−0.9V), and inversion mode is when $V_{GB}$ is greater than $V_T$ (typically 0.45V for 65 nm process).

In the techniques described in this disclosure, rather than connecting the drain and source terminals together, the drain and source terminals are left floating (i.e., electrically unconnected). For example, FIG. 1 illustrates MOS capacitor 10 that is formed with MOS transistor 12, with source and drain terminals floating. The gate terminal of transistor 12 is coupled to electrical conductor 11 (e.g., a wire or some other conductor that carries voltage or current) and the body terminal of transistor 12 is coupled to ground. Accordingly, if the voltage at the gate terminal ($V_G$) is greater than $V_{FB}$, capacitor 10 operates in accumulation mode.

As illustrated, the drain and source terminals of transistor 12 are not coupled to any another device and left floating. Floating as used in this disclosure means that the drain and source terminals are not electrically connected to any other node including ground. Stated another way, the voltage at the drain and source terminals is not set from any coupling of the drain and source terminals to any other node (e.g., physical connection point). The wells to form in the source and drain terminals exist in the body substrate, just that the source and drain terminals are not electrically connected to any other conductor outside of the wells and substrate of transistor 12.

In FIG. 1, Vin represents the voltage that a voltage source delivers to chip 14 to power chip 14. The current that the voltage source outputs through inductor L and to chip 14. Inductor L protects against transient jumps in the current outputted by the voltage source. The voltage and current enters chip 14 via electrical conductor 11, and the voltage Vin is applied to the gate of transistor 12 of capacitor 10. If Vin is greater than $V_{GS}$, then capacitor 10 is in accumulation mode. The configuration in FIG. 1 is an example of capacitor 10 decoupling the voltage source.

By leaving the drain and source terminals floating, the static leakage of capacitor 10, when driven in accumulation mode, may be much lower than that of MOS capacitors where the drain and source terminals are not floating, and in some examples, the static leakage of capacitor 10 may be approximately the same as that of a deep trench capacitor. For example, leakage of MOS capacitor 10 is approximately 50 nA when approximately 0.35 V are applied to MOS capacitor 10 (e.g., applied to the gate terminal). As described in more detail, by coupling a plurality of capacitors in parallel with capacitor 10 to form a composite capacitor, the overall capacitive density of such a composite capacitor may be greater and approximately the same as that of a deep trench capacitor.

Accordingly, FIG. 1 illustrates IC chip 14 that includes MOS capacitor 10 formed from MOS transistor 12 having a drain terminal, a source terminal, a gate terminal, and a body terminal. The drain terminal and the source terminal are not electrically connected to any other node, and the gate terminal and the body terminal form respective first and second terminals of MOS capacitor 10. IC chip 14 also includes electrical conductor 11 coupled to one of the gate terminal or the body terminal of MOS transistor 12 and configured to deliver a voltage to operate MOS capacitor 10 in an accumulation mode.

As described above, capacitor 10 may be formed using standard CMOS processes without the need of additional specialized processes as needed for deep trench. For instance, chip 14 includes a plurality of transistors and transistor 12 is one of these transistors. One potential advantage may be that transistor 12 and the plurality of transistors are formed using the same process technology without needing a specialized process to form capacitor 10. Examples of the process technology includes one of a 32 nm process technology, 45 nm process technology, or 65 nm process technology.

Figure 2:
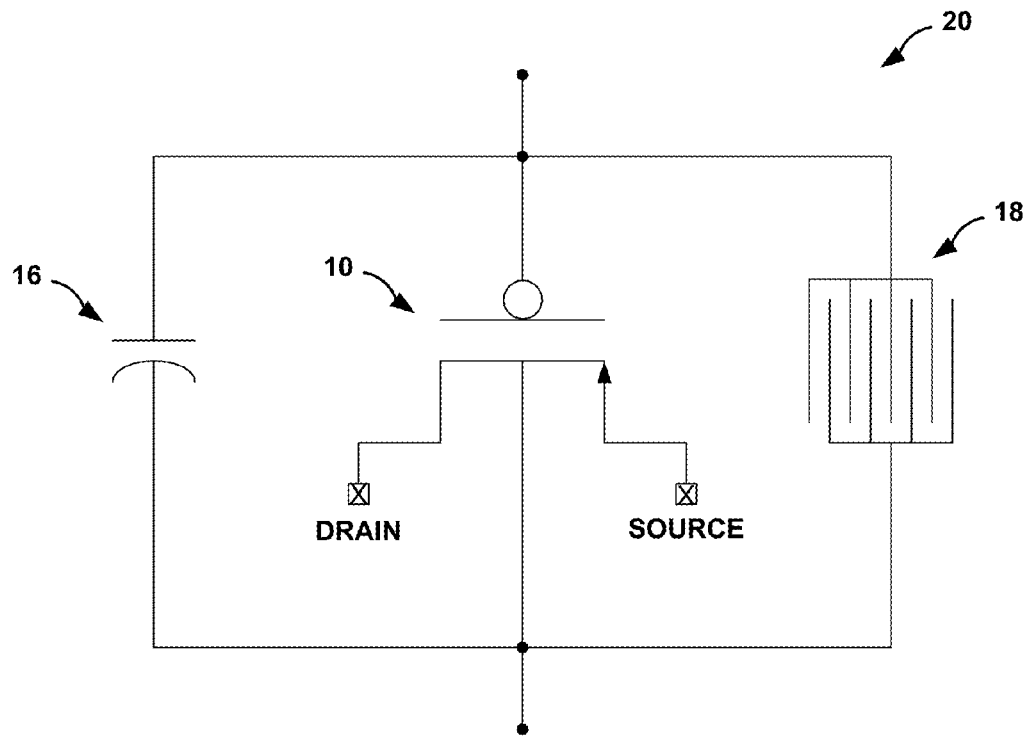
FIG. 2 is a block diagram illustrating an example of a composite capacitor that includes a capacitor in accordance with one or more examples described in this disclosure and one or more additional capacitors.

FIG. 2 is a block diagram illustrating an example of a composite capacitor that includes a capacitor in accordance with one or more examples described in this disclosure and one or more additional capacitors. In the example illustrated in FIG. 2, MOS capacitor 10 is coupled in parallel with metal-insulator-metal (MIM) capacitor 16 and coupled in parallel with metal-oxide-metal (MOM) capacitor 18. It should be understood that the example illustrated in FIG. 2 is one example configuration. In other examples, there may be only one of MIM capacitor 16 or MOM capacitor 18 in parallel with MOS capacitor 10. In some examples, there may be multiple MIM capacitors, each similar to MIM capacitor 16, and no MOM capacitor 18, or there may be multiple MOM capacitors, each similar to MOM capacitor 18, and no MIM capacitor 16. In some examples, there may be multiple MIM capacitors and multiple MOM capacitors in parallel with MOS capacitor 10. In some examples, there may be multiple MOS capacitors, each similar to capacitor 10, in parallel with or without there being MIM and MOM capacitors in parallel.

The example of MIM capacitor 16, MOS capacitor 10, and MOM capacitor 18 coupled in parallel form composite capacitor 20. By coupling MIM capacitor 16, MOS capacitor 10, and MOM capacitor 18 in parallel, the capacitive density of composite capacitor 20 may be approximately the same as that of a deep trench capacitor. For example, composite capacitor 20 may include the following characteristics. The capacitive density of composite capacitor 20 may be relatively high in a regular CMOS process without any extra processing steps. As an example, the capacitive density may be 23.4 fF/um² in 40 nm process technology and 18.5 fF/um² in 65 nm process technology, which are both approximately the same as for deep trench capacitor. The leakage may be relatively low in accumulation mode, such as approximately 2 uA/mm², which is approximately 40 times less than other MOS capacitors where drain and source terminals are not floating.

Composite capacitor 20 may be usable as a two terminal capacitor, rather than a requirement that one of the terminals be connected to ground. In some examples, the bottom plate parasitic capacitance is about 3% with negligible top plate capacitance. This allows composite capacitor 20 to usable for more purposes than just decoupling. For example, composite capacitor 20 is a two terminal capacitor for DC as well as high frequency applications. One of the reasons that composite capacitor 20 may be usable as a two terminal capacitor is that a capacitance of MOS capacitor 10 is relatively constant as a function of voltage when MOS capacitor 10 is in an accumulation mode as compared to a capacitance of MOS capacitor 10 when MOS capacitor 10 is in an inversion mode.

In some examples, composite capacitor 20 may be more linear (e.g., less dependent on the voltage of operation). For example, in accumulation mode, the capacitance of MOS capacitor 10 tends to be less sensitive to the operating voltage, which causes composite capacitor 20 to be less sensitive to the operating voltage.

Figure 3:
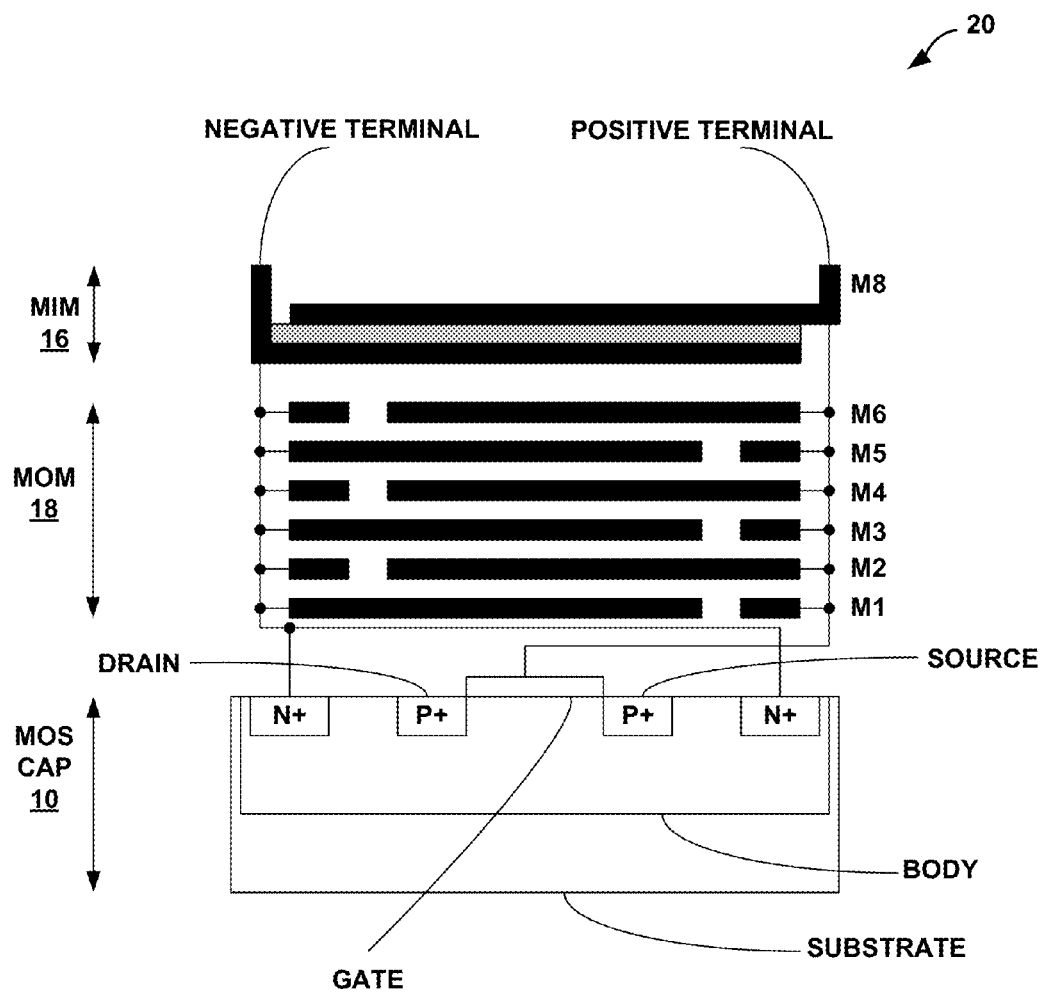
FIG. 3 is a block diagram illustrating a structure of a composite capacitor that includes a capacitor in accordance with one or more examples described in this disclosure and one or more additional capacitors.

FIG. 3 is a block diagram illustrating a structure of a composite capacitor that includes a capacitor in accordance with one or more examples described in this disclosure and one or more additional capacitors. FIG. 3 shows the cross-sectional view of composite capacitor 20 in more detail. The example of composite capacitor 20 may be formed in 65 nm process technology with a 9 metal process. The size of composite capacitor 20 may be approximately 2500 um$^2$ in the 65 nm process technology.

MIM capacitor 16, MOM capacitor 18, and MOS capacitor 10 may be physically laid over one another, which saves area and also improves the capacitive density. At the bottom most is capacitor 10 in accumulation mode. The drain and source terminals are formed as the p-wells in of transistor 12. As illustrated, the p-wells are not coupled to any other node. It should be understood that to the extent the p-wells are formed in the body, the p-wells should not be considered as being electrically connected to the body. For instance, the voltage of the body and the voltage at either the drain and source terminals may be different from one another meaning that the potential of each is floating relative to one another. Also, the impedance between the drain and source terminals and the body may be relatively high.

In some examples, the p-wells (i.e., the drain and source terminals) should be relatively small (e.g., approximately less than <1% of MOS area). The size of p-wells affects the amount of leakage, but has less effect on the capacitance. By keeping the size of the p-wells relatively small, the current leakage may be even further reduced from only leaving the source and drain terminals open.

By leaving the source and drain terminals open (e.g., floating), the quality factor and capacitance at higher frequencies may be better for composite capacitor 20, as compared to where source and drain wells are coupled to other nodes or coupled to one another. For low effective series resistance (ESR), the dimensions of the gate terminal between the two p-wells is approximately 5 um×5 um.

In FIG. 3, the n-wells form the body connection used to form one of the terminals of composite capacitor 20. The resistance through the n-wells should be kept minimum to maintain good quality factor. Accordingly, the position and size of n-wells may be selected to keep a high quality factor and low effective series resistance.

Next on the stack of composite capacitor 20 is MOM capacitor 18. MOM capacitor 18 is formed with six metal layers (M1-M6), and may be formed in a "fingered" pattern (e.g., appears like interlocking fingers running in parallel). For example, for each metal layer, MOM capacitor 18 may be formed by routing of lines, and having a gap between routing lines. The routing lines at each layer may be interspersed in a "fingering" like pattern, shown graphically in FIG. 2. The capacitance from the fingering provides horizontal capacitance, also called fringe capacitance, and the metal layers provide vertical capacitance.

The n-wells of MOS transistor 12 may be coupled to one end of the six metal layers and the gate terminal of MOS transistor 12 may be coupled to the other end of the six metal layers. MOM capacitor 18 contributes to the overall capacitive density due to the metallic overlap and fringe capacitance. In some cases, for better routing, some of the intermediate metal layers may be skipped with low impact on the overall capacitance.

MIM capacitor 16 may be coupled to the top of MOM capacitor 18. As illustrated, one end of the metal layers is coupled to one end of MIM capacitor 16 and the other end of the metal layers is coupled to the other end of MIM capacitor 16. MIM capacitor 16 may be formed with high quality metal eight (M8). The total vertical stack of composite capacitor 20 may be filled with metal to maximize the capacitance of each constitute (e.g., MOS capacitor 10, MIM capacitor 16, and MOM capacitor 18) of composite capacitor 20.

MOS capacitor 10 may contribute the maximum to the overall capacitance of composite capacitor 20, and MIM capacitor 16 and MOM capacitor 18 may be contribute equal to the overall capacitance of composite capacitor 20. For example, MOS capacitor 10 may contribute 60% to the overall capacitance, and MIM capacitor 16 and MOM capacitor 18 may contribute 20% each.

Accordingly, in some examples, chip 14 may also include MIM capacitor 16 in parallel with MOS capacitor 10, MOM capacitor 18 in parallel with MOS capacitor 10, or MIM capacitor, MOM capacitor 18, and MOS capacitor 10 all coupled together in parallel to form composite capacitor 20. A capacitive density of composite capacitor 20 is approximately 18 fF/um$^2$ and a leakage of composite capacitor 20 is approximately 100 to 500 nA/mm$^2$.

Figure 4:
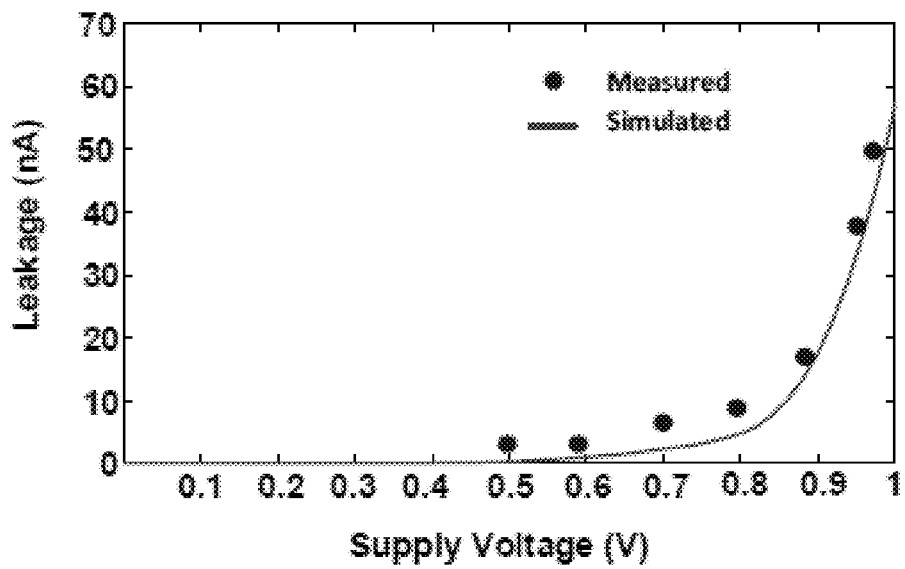
FIG. 4 is a graph illustrating measured and simulated leakage of a composite capacitor as a function of supply voltage.

FIG. 4 is a graph illustrating measured and simulated leakage of a composite capacitor as a function of supply voltage. The measurements for FIG. 4 were performed with composite capacitor 20 formed on 65 nm process technology at 27° C. The size of composite capacitor 20 is 2500 um$^2$ in the example of FIG. 4. In FIG. 4, the capacitance of composite capacitor 20 is 212 pF at 0.9 V. The static current leakage is predominantly due to the MOS accumulation mode leakage. For voltages close to 1V, the leakage current is around 53 nA, and falls rapidly to few nano-amperes for voltages approximately equal to 0.6 to 0.5 V.

Figure 5:
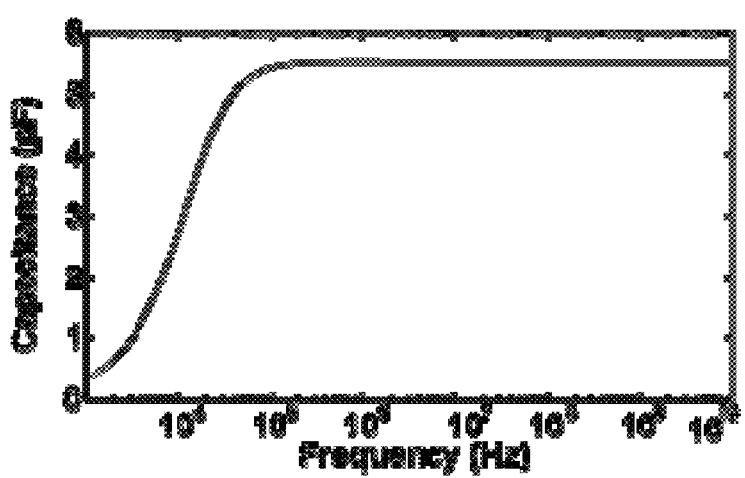
FIG. 5 is a graph illustrating capacitance of a composite capacitor as a function of frequency.

FIG. 5 is a graph illustrating capacitance of a composite capacitor as a function of frequency. The measurements for FIG. 5 were performed with composite capacitor 20 formed on 65 nm process technology at 27° C. The size of composite capacitor 20 is 2500 um$^2$ in the example of FIG. 5. FIG. 5 illustrates that the density of composite capacitor 20 is approximately 18.5 fF/um$^2$.

Figure 6:
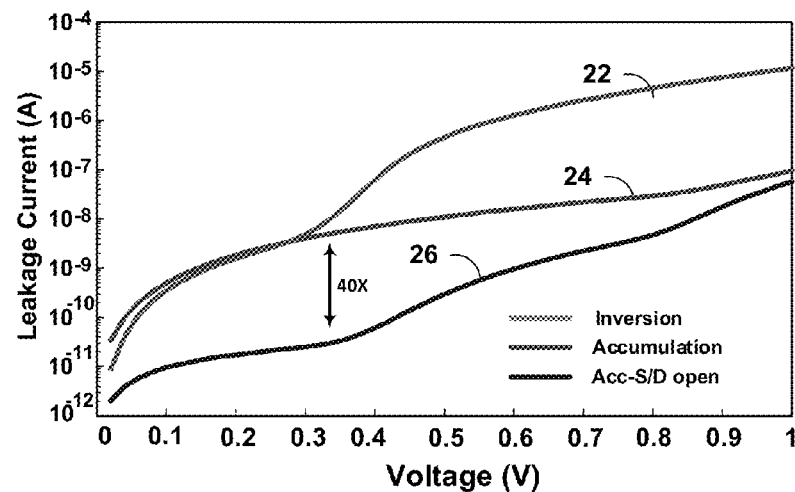
FIG. 6 is a graph illustrating leakage current as a function of voltage for different types of capacitors.

FIG. 6 is a graph illustrating leakage current as a function of voltage for different types of capacitors. As described above, one example of a MOS capacitor is a MOS capacitor in inversion mode with the drain, source, and body terminal coupled together. Line 22 in FIG. 6 illustrates the leakage of such a capacitor as a function of voltage. One example of a MOS capacitor is a MOS capacitor in accumulation mode with the drain, source, and body terminal coupled together. Line 24 in FIG. 6 illustrates the leakage of such a capacitor as a function of voltage (Area=2500 um$^2$). Line 26 illustrates the leakage as a function of voltage of MOS capacitor 10 (e.g., where the drain and source terminals are floating). As can be seen, at approximately, 0.35 V, where the leakage current is approximately 50 nA, MOS capacitor 10 tends to leak 40 times less than MOS capacitor with drain, source, and body coupled together.

Table 1 below provides a summary comparison between composite capacitor 20 and some other ways in which capacitors are formed. The capacitors were formed using a 45 nm process technology, and the leakage data is determined at 0.5 V DC voltage across the two terminals of the capacitor.

TABLE 1

| TYPE | Cap density (fF/um$^2$) | Leakage (nA/mm$^2$) | Bottom Plate Q factor | Process Complexity | |
|---|---|---|---|---|---|
| MIM | 1-3 | 0.1-1 | 2-5% | 50-150 | Standard |
| MOM | 2-5 | 0.01-0.1 | 1-3% | 10-50 | Standard |
| Poly-Poly | 1-2 | 0.1-1 | 5-10% | 10-15 | Extra Steps |
| MOS | 10-14 | 10$^5$-10$^6$ | 10-15% | 2-10 | Standard |
| Deep Trench (per trench) | 25-60 | 0.1-10 | 1-2% | 20-50 | Extra Steps |
| Composite Cap 20 | 18 | 100-500 | 3.5% | 25-50 | Standard |

As described above, MOS capacitor 10 and composite capacitor 20, which includes MOS capacitor 10, may be used in a plurality of different designs. Table 2 below summarizes some example applications where the MOS capacitor 10 and/or composite capacitor 20 may be used.

TABLE 2

| Decoupling Capacitors | Power Conversion | Analog | Memories | Miscellaneous |
|---|---|---|---|---|
| Input power decoupling | DC-DC converters | Compensation networks | DRAM cells | Active Oscillators |
| Signal decoupling | Output ripple filtering | Filters (Passives + Actives) | SRAM cells | VCOs |
| Output decoupling | On chip SMPS | Regular Amplifier Biasing | | Matching networks |
| 90% impact | 90% impact | 50% impact | 50% impact | 50% impact |

Figure 7:
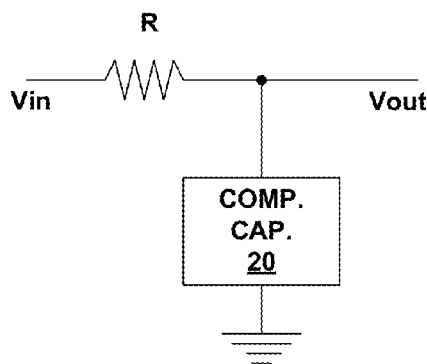
FIG. 7 is a block diagram illustrating an example low pass filter that uses a capacitor in accordance with examples described in this disclosure.

FIG. 7 is a block diagram illustrating an example low pass filter that uses a capacitor in accordance with examples described in this disclosure. As illustrated in FIG. 7, composite capacitor 20 forms an RC circuit with resistor R. Vout may be a low pass filtered version of Vin. For example, for high frequency components of Vin, composite capacitor 20 is low impedance, and composite capacitor 20 filters out those components. For low frequency components of Vin, composite capacitor 20 is high impedance, and those components remain in Vout. Although composite capacitor 20 is illustrated in FIG. 7, in some examples, only MOS capacitor 10 may be used or some other configuration of one or more MOS capacitors 10 with or without one or more MIM capacitors 16 and/or MOM capacitors 18.

Figure 8:
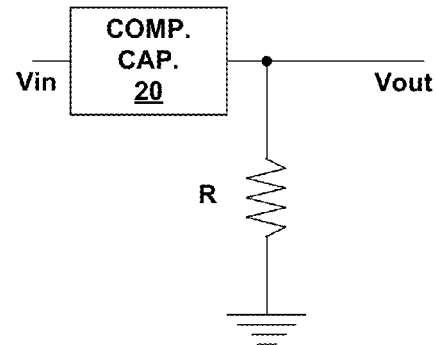
FIG. 8 is a block diagram illustrating an example high pass filter that uses a capacitor in accordance with examples described in this disclosure.

FIG. 8 is a block diagram illustrating an example high pass filter that uses a capacitor in accordance with examples described in this disclosure. As illustrated in FIG. 8, similar to FIG. 7, composite capacitor 20 forms an RC circuit with resistor R. Vout may be a high pass filtered version of Vin. For example, for high frequency components of Vin, composite capacitor 20 is low impedance, and composite capacitor 20 passes those components to Vout. For low frequency components of Vin, composite capacitor 20 is high impedance, and blocks those components from Vout. Like FIG. 7, although composite capacitor 20 is illustrated in FIG. 8, in some examples, only MOS capacitor 10 may be used or some other configuration of one or more MOS capacitors 10 with or without one or more MIM capacitors 16 and/or MOM capacitors 18.

Figure 9:
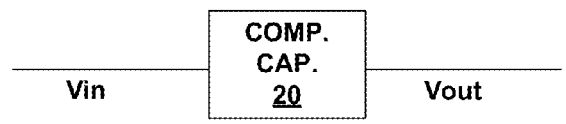
FIG. 9 is a block diagram illustrating an example AC-coupling capacitor in accordance with examples described in this disclosure.

FIG. 9 is a block diagram illustrating an example AC-coupling capacitor in accordance with examples described in this disclosure. In the illustrated example, composite capacitor 20 may block DC components from Vin to Vout, but allow AC components to flow through. In this example, composite capacitor 20 may function as a two terminal capacitor, where one of the terminals does not need to be connected to ground. Like FIGS. 7 and 8, although composite capacitor 20 is illustrated in FIG. 9, in some examples, only MOS capacitor 10 may be used or some other configuration of one or more MOS capacitors 10 with or without one or more MIM capacitors 16 and/or MOM capacitors 18.

Figure 10:
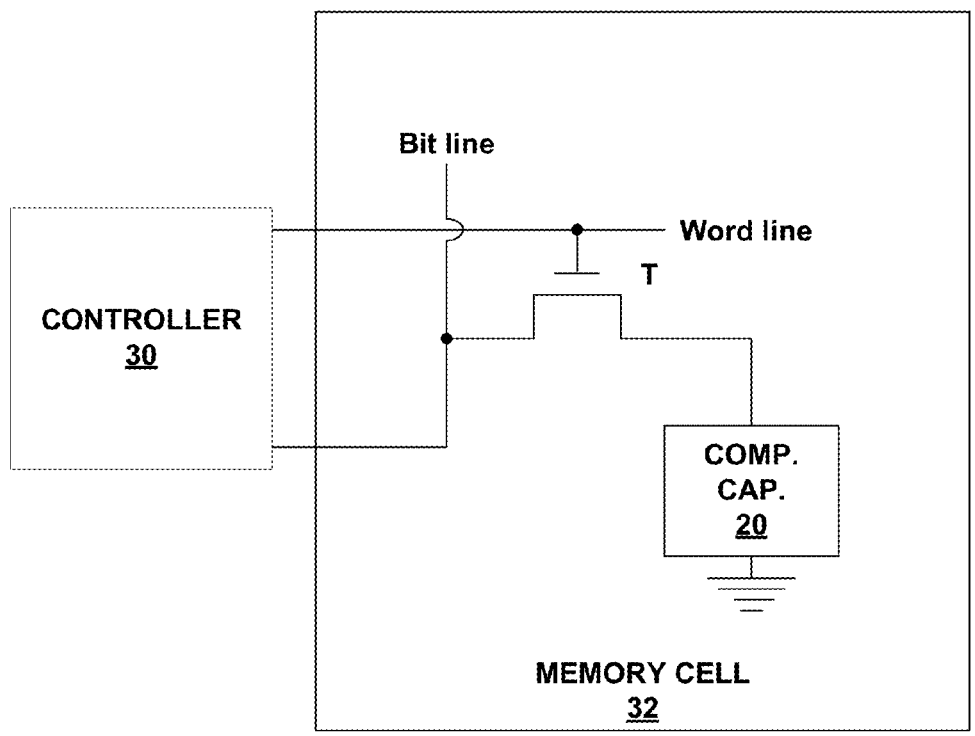
FIG. 10 is a block diagram illustrating an example memory cell using a capacitor in accordance with examples described in this disclosure.

FIG. 10 is a block diagram illustrating an example memory cell using a capacitor in accordance with examples described in this disclosure. Controller 30 may be integrated circuitry that resides on the same chip as memory cell 32 or on a different chip than memory cell 32. Memory cell 32 is an example of a dynamic random access memory (DRAM) cell, but other example types of memory cells are possible. Although only one memory cell 32 is illustrated, there may be a plurality of similar memory cells for reading and writing data.

Controller 30 may be configured to write data to memory cell 32 or read data from memory cell 32. The data that controller 30 writes may be logic ones or logic zeros, where a voltage greater than zero represents logic ones and voltage approximately equal to zero represents logic zeros. Composite capacitor 20 is the example storage element of memory cell 32. Although composite capacitor 20 is illustrated as the storage element, in some examples, MOS capacitor 10 by itself may be the storage element. In some examples, one or more MOS capacitors 10 with or without one or more MIM capacitors 16 and/or MOM capacitors 18 may together form the storage element.

Although the leakage of composite capacitor 20 may be relatively low, the charge stored on composite capacitor 20 may still drop due to there being some leakage. Controller 30 may periodically refresh (e.g., read and rewrite) the value stored on composite capacitor 20 to address the loss in charge from leakage.

To read from composite capacitor 20, controller 30 may output a voltage to the gate of transistor T via the word line. The voltage applied to the gate causes transistor T to conduct, and the charge stored on composite capacitor 20 transfers to the bit line, and then to controller 30. In some examples, because the reading of composite capacitor 20 causes the charge to deplete, controller 30 may rewrite the value after each read.

To write to composite capacitor 20, controller 30 may output a voltage that represents the value to stored (e.g., voltage greater than zero if a logic one is to be stored or output no voltage if a logic zero is to be stored) to the bit line. Composite capacitor 20 may also output a voltage on the word line to turn on transistor T. The voltage that controller 30 outputted on the bit line then transfers to composite capacitor 20 after transistor T turns on. Controller 30 may keep the voltage on the bit line for as long as it takes for composite capacitor to fully charge for a logic one or fully discharge for a logic zero.

Accordingly, FIG. 10 illustrates an example of an electronic device that includes controller 30 and memory cell 32. Controller 30 may be configured to output a voltage representing a logic one or a logic zero. Memory cell 32 includes MOS capacitor 10 (e.g., as part of composite capacitor 20). MOS capacitor 10 is formed from MOS transistor 12 having a drain terminal, a source terminal, a gate terminal, and a body terminal. The drain terminal and the source terminal are not electrically connected to any other node (e.g., floating), and the gate terminal and the body terminal form respective first and second terminals of MOS capacitor 10. In some examples, MOS capacitor 10 operates in an accumulation mode. MOS capacitor 10 is configured to store charge from the voltage output by controller 30 to store a logic one or discharge from the voltage output by controller 32 to store a logic zero.

Figure 11:
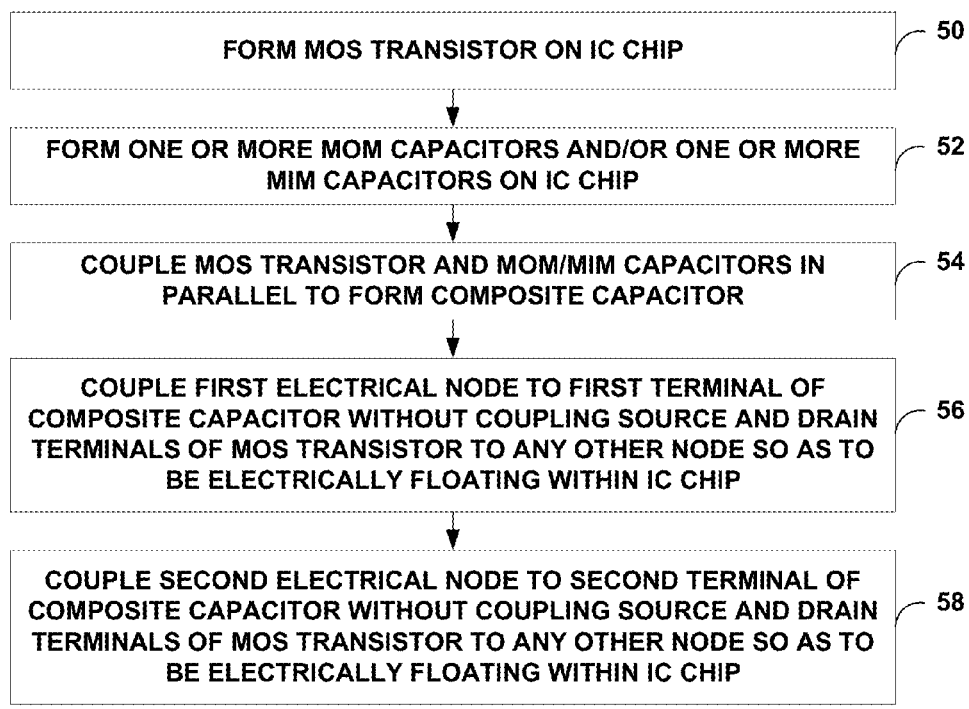
FIG. 11 is a flowchart illustrating an example method of manufacturing an integrated circuit so as to provide capacitance within the integrated circuit in accordance to example techniques described herein.

FIG. 11 is a flowchart illustrating an example method of manufacturing an integrated circuit so as to provide capacitance within the integrated circuit in accordance to example techniques described herein. During the manufacturing process of the IC chip, the IC chip may be manufactured to include on-chip capacitors.

To provide the capacitance, the chip manufacturer may form MOS transistor 12 on the IC chip where MOS transistor 12 forms part of composite capacitor 20 or may be the composite capacitor 20 itself (50). In the example techniques described in this disclosure, no specialized process may be needed, and any integrated circuit manufacturing process may be used.

While MOS transistor 12, by itself, may be composite capacitor 20, in some examples, the chip manufacturer may form one or more MOM capacitors 18 and/or one or more MIM capacitors 16 on the IC chip (52). Example structures of the MOM capacitor 18 and MIM capacitor 16 is provided in FIG. 3 and corresponding text. The chip manufacturer may couple the MOM capacitors 18 and/or MIM capacitors 16 with MOS transistor 12 in parallel to form the composite capacitor 20 (54). For example, the chip manufacturer may couple respective first terminals of the MOM capacitors 18 and/or MIM capacitors 16 with one of a gate or body terminal of MOS transistor 12 and couple respective second terminals of the MOM capacitors 18 and/or MIM capacitors 16 with the other one of the gate or body terminal of MOS transistor 12 to couple the MOM capacitors 18 and/or MIM capacitors 16 and MOS transistor 12 in parallel to form composite capacitor 20.

Composite capacitor 20 may be configured to provide the capacitance on the IC chip. For example, the chip manufacturer may couple a first electrical terminal of the IC chip to a first terminal of composite capacitor 20 without coupling source and drain terminals of the MOS transistor 12 to any other node so as to be electrically floating within the IC chip (56). The first terminal of composite capacitor 20 is coupled to one of the body or gate terminals of MOS transistor 12. The first electrical node may be a terminal, power line, or some other structure within the IC chip. As an example, the first electrical node may be electrical conductor 11 of FIG. 1, and the first terminal of composite capacitor 20 may be the terminal coupled to the gate terminal of MOS transistor 12.

Similarly, the chip manufacturer may couple a second electrical terminal of the IC the IC chip to a second terminal of composite capacitor 20 without coupling source and drain terminals of the MOS transistor 12 to any other node so as to be electrically floating within the IC chip (58). The second terminal of composite capacitor 20 is coupled to other one of the body or gate terminals of MOS transistor 12. Like the first electrical node, the second electrical node may be a terminal, power line, or some other structure within the IC chip. As an example, the second electrical node may be electrical conductor coupled to the ground voltage, and the second terminal of composite capacitor 20 may be the terminal coupled to the body terminal of MOS transistor 12.

In this way, the chip manufacturer may form a capacitor having low static leakage of current when driven in accumulation mode (e.g., MOS transistor 12), and to provide additional capacitance, couple in parallel high capacitive density capacitors (e.g., MIM capacitor(s) 16 and MOM capacitor(s) 18). The resulting composite capacitor 20 may provide high capacitive density and low leakage that is comparable to deep trench capacitors.

Various aspects of the disclosure have been described. These and other examples are within the scope of the following claims.

The invention claimed is:

1. An integrated circuit (IC) chip comprising:
   a metal-oxide-silicon (MOS) capacitor comprising a MOS transistor having a drain terminal, a source terminal, a gate terminal, and a body terminal,
   wherein the drain terminal and the source terminal are not electrically connected to any other node within the IC chip so as to be electrically floating within the IC chip, and
   wherein the gate terminal and the body terminal of the MOS transistor form respective first and second terminals of the MOS capacitor;
   a first conductor coupled to the gate terminal; and
   a second conductor coupled to the body terminal,
   wherein the first and second conductors set a potential at the gate terminal relative to a potential at the body terminal to configure and operate the MOS capacitor in an accumulation mode.

2. The IC chip of claim 1, further comprising:
   a metal-insulator-metal (MIM) capacitor coupled in parallel with the MOS capacitor.

3. The IC chip of claim 1, further comprising:
   a metal-oxide-metal (MOM) capacitor coupled in parallel with the MOS capacitor.

4. The IC chip of claim 3, further comprising:
   a metal-insulator-metal (MIM) capacitor coupled in parallel with the MOS capacitor and the MOM capacitor.

5. The IC chip of claim 4, wherein the parallel connection of the MOS capacitor, MOM capacitor, and MIM capacitor forms a composite capacitor, wherein a capacitive density of the composite capacitor is approximately 18 fF/um$^2$, and wherein a leakage of the composite capacitor is approximately 100 to 500 nA/mm$^2$.

6. The IC chip of claim 4, wherein the parallel connection of the MOS capacitor, MOM capacitor, and MIM capacitor forms a composite capacitor, wherein the MOS capacitor contributes 60% capacitance of the composite capacitor, wherein the MOM capacitor contributes 20% capacitance of the composite capacitor, and wherein the MIM capacitor contributes 20% capacitance of the composite capacitor.

7. The IC chip of claim 4, wherein the parallel connection of the MOS capacitor, MOM capacitor, and MIM capacitor forms a composite capacitor, and wherein a size of the composite capacitor is approximately 2500 um$^2$ in a 65 nm process technology.

8. The IC chip of claim 1, wherein the MOS transistor comprises a first MOS transistor, the IC chip further comprising a plurality of MOS transistors, and wherein the first MOS transistor and the plurality of MOS transistors are formed using the same process technology.

9. The IC chip of claim 8, wherein the process technology comprises one of a 32 nm process technology, 45 nm process technology, or 65 nm process technology.

10. The IC chip of claim 1, wherein a leakage of the MOS capacitor is approximately 50 nA when approximately 0.35 V are applied to the MOS capacitor.

11. The IC chip of claim 1, wherein a size of the drain terminal and source terminal is approximately 1% of a composite capacitor that includes the MOS capacitor.

12. The IC chip of claim 1, wherein a capacitance of the MOS capacitor is relatively constant as a function of voltage when the MOS capacitor is in the accumulation mode as compared to a capacitance of the MOS capacitor when the MOS capacitor is in an inversion mode.

13. The IC chip of claim 1, wherein the IC chip comprises one of: a DC-DC converter, an amplifier, a memory cell, and an oscillator.

14. An electronic device comprising:
a voltage source configured to deliver voltage; and
an integrated circuit (IC) chip comprising:
 a metal-oxide-silicon (MOS) capacitor formed from a MOS transistor having a drain terminal, a source terminal, a gate terminal, and a body terminal, wherein the drain terminal and the source terminal are not electrically connected to any other node so as to be electrically floating within the IC chip, and wherein the gate terminal and the body terminal of the MOS transistor form respective first and second terminals of the MOS capacitor,
 wherein the first terminal is coupled to the voltage source,
 wherein the second terminal is coupled to ground,
 wherein the voltage delivered by the voltage source configures the MOS transistor in an accumulation mode, and
 wherein the MOS capacitor is configured to decouple the voltage delivered by the voltage source.

15. An electronic device comprising:
a controller configured to output a voltage representing a logic one or a logic zero; and
a memory cell comprising:
 a metal-oxide-silicon (MOS) capacitor formed from a MOS transistor having a drain terminal, a source terminal, a gate terminal, and a body terminal, wherein the drain terminal and the source terminal are not electrically connected to any other node, wherein the gate terminal and the body terminal form respective first and second terminals of the MOS capacitor, wherein the MOS transistor operates in an accumulation mode, and wherein the MOS capacitor is configured to store charge from the voltage output by the controller to store a logic one or discharge from the voltage output by the controller to store a logic zero.

16. A method of manufacturing an integrated circuit (IC) chip to provide capacitance within the IC chip, the method comprising:
 forming a metal-oxide silicon (MOS) transistor on the IC chip, wherein the MOS transistor is part of a composite capacitor;
 coupling a first electrical node of the IC chip to a first terminal of the composite capacitor without coupling source and drain terminals of the MOS transistor to any other node so as to be electrically floating within the IC chip, wherein the first terminal of the composite capacitor is coupled to one of a body terminal or gate terminal of the MOS transistor; and
 coupling a second electrical node of the IC chip to a second terminal of the composite capacitor without coupling source and drain terminals of the MOS transistor to any other node so as to be electrically floating within the IC chip, wherein the second terminal of the composite capacitor is coupled to the other of the body terminal or gate terminal of the MOS transistor.

17. An integrated circuit (IC) chip comprising:
a metal-oxide-silicon (MOS) capacitor comprising a MOS transistor having a drain terminal, a source terminal, a gate terminal, and a body terminal,
wherein the drain terminal and the source terminal are not electrically connected to any other node within the IC chip so as to be electrically floating within the IC chip, and
wherein the gate terminal and the body terminal of the MOS transistor form respective first and second terminals of the MOS capacitor; and
at least one of:
 a metal-insulator-metal (MIM) capacitor coupled in parallel with the MOS capacitor, or
 a metal-oxide-metal (MOM) capacitor coupled in parallel with the MOS capacitor.

18. The IC chip of claim 17, further comprising both the MIM capacitor and the MOM capacitor.

19. The IC chip of claim 17, wherein the MOS transistor comprises a first MOS transistor, the IC chip further comprising a plurality of MOS transistors, and wherein the first MOS transistor and the plurality of MOS transistors are formed using the same process technology.

20. The IC chip of claim 17, wherein a size of the drain terminal and source terminal is approximately 1% of a composite capacitor that includes the MOS capacitor.

* * * * *